(12) United States Patent
Economikos et al.

(10) Patent No.: US 6,773,570 B2
(45) Date of Patent: Aug. 10, 2004

(54) INTEGRATED PLATING AND PLANARIZATION PROCESS AND APPARATUS THEREFOR

(75) Inventors: Laertis Economikos, Wappingers Falls, NY (US); Hariklia Deligianni, Tenafly, NJ (US); John M. Cotte, New Fairfield, CT (US); Henry J. Grabarz, Shelton, CT (US); Bomy Chen, Cupertino, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/294,200

(22) Filed: Nov. 14, 2002

(65) Prior Publication Data

US 2004/0094427 A1 May 20, 2004

(51) Int. Cl.[7] .............................. C25D 5/22; C25D 5/48; C25D 17/00
(52) U.S. Cl. ..................... 205/93; 204/212; 204/224 R; 204/272; 204/275.1; 205/103; 205/117; 205/123; 205/143; 205/222; 205/223; 205/917
(58) Field of Search .......................... 205/93, 103, 117, 205/123, 143, 222, 223, 917, 640, 647, 663; 204/212, 224 R, 272, 275.1

(56) References Cited

U.S. PATENT DOCUMENTS

| | | | |
|---|---|---|---|
| 5,911,619 A | 6/1999 | Uzoh et al. | |
| 6,004,880 A | 12/1999 | Liu et al. | |
| 6,270,646 B1 | 8/2001 | Walton et al. | |
| 6,328,872 B1 | 12/2001 | Talieh et al. | |
| 6,454,916 B1 * | 9/2002 | Wang et al. | 204/224 R |
| 6,478,936 B1 * | 11/2002 | Volodarsky et al. | 204/286.1 |
| 2003/0183530 A1 * | 10/2003 | Chou et al. | 205/157 |

* cited by examiner

*Primary Examiner*—Roy King
*Assistant Examiner*—William T. Leader
(74) *Attorney, Agent, or Firm*—Jay H. Anderson

(57) ABSTRACT

A method and apparatus are described for performing both electroplating of a metal layer and planarization of the layer on a substrate. Electroplating and electroetching of metal (such as copper) are performed in a repeated sequence, followed by chemical-mechanical polishing. An electroplating solution, electroetching solution, and a non-abrasive slurry are dispensed on a polishing pad in the respective process steps. The substrate is held against the pad with a variable force in accordance with the process, so that the spacing between substrate and pad may be less during electroplating than during electroetching.

20 Claims, 9 Drawing Sheets

INTEGRATED PLATING AND PLANARIZATION PROCESS AND APPARATUS THEREFOR

FIELD OF THE INVENTION

This invention relates to semiconductor processing, and more particularly to a process and apparatus for plating and planarization of a copper layer on a semiconductor wafer.

BACKGROUND OF THE INVENTION

In the fabrication of semiconductor devices, deposition and selective removal of metallic layers are important processes. A typical semiconductor wafer has several layers of metal deposited or plated on its surface, with each successive layer being polished or etched before further layers are added. In particular, electroplating of copper on the wafer surface is a widely practiced process. Plating of copper (which generally produces a blanket layer of copper on the wafer) is typically followed by chemical-mechanical polishing (CMP) to remove unwanted portions of the plated layer. When a damascene structure is being fabricated, the CMP process also serves to electrically isolate the damascene wires.

Figure 1A:
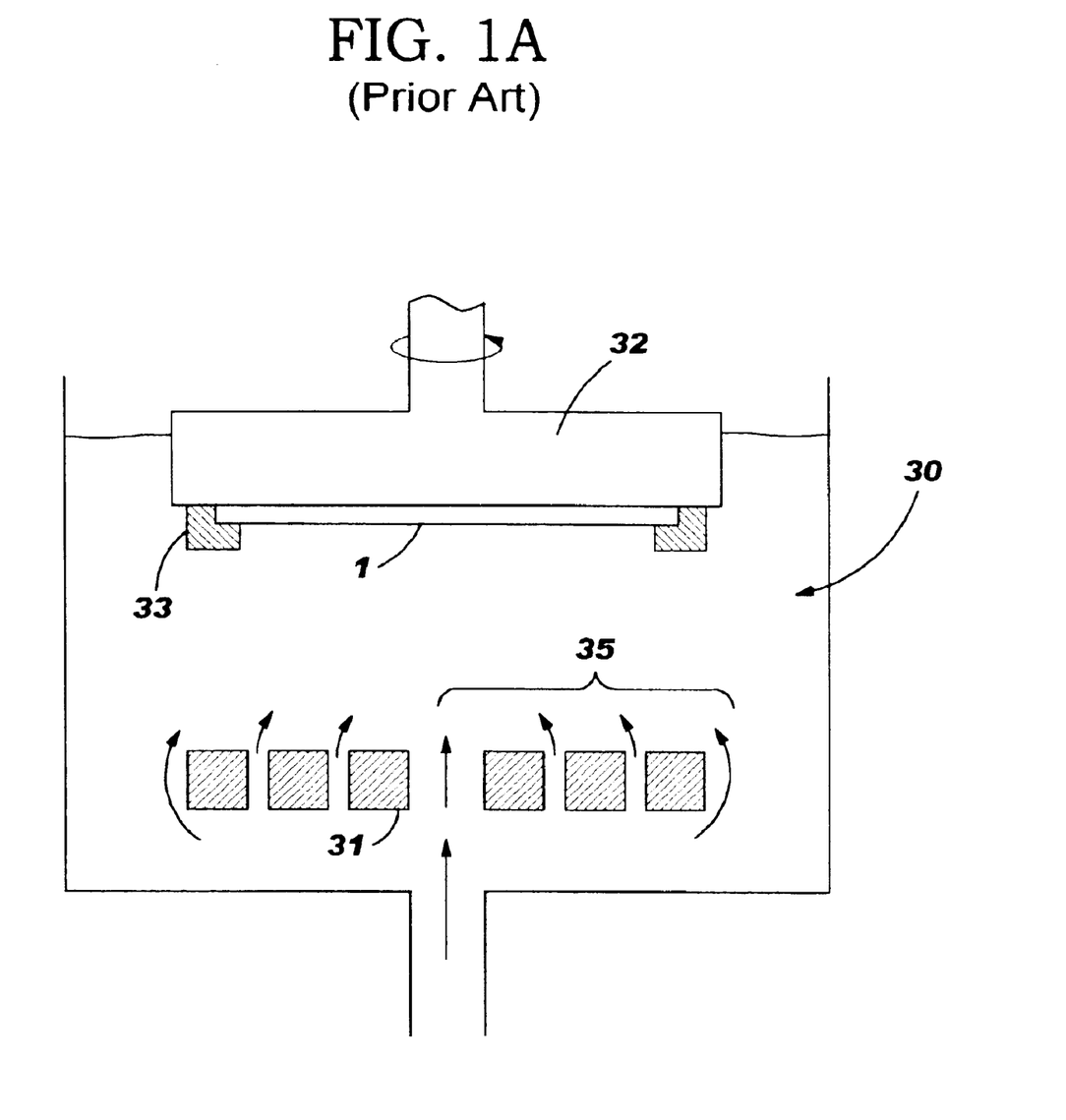
FIG. 1A is a schematic illustration of a conventional electroplating apparatus used to plate metal on a wafer.

FIG. 1A is a schematic illustration of a typical apparatus for plating copper on a wafer. Wafer 1 is held against a cathode 32 by sealed contacts 33; the cathode and wafer rotate in a bath 30 of plating solution. A flow 35 of plating solution is pumped through the apparatus to continually refresh the bath; the flow is directed around plating anode 31 and through holes in the anode.

Figure 1B:
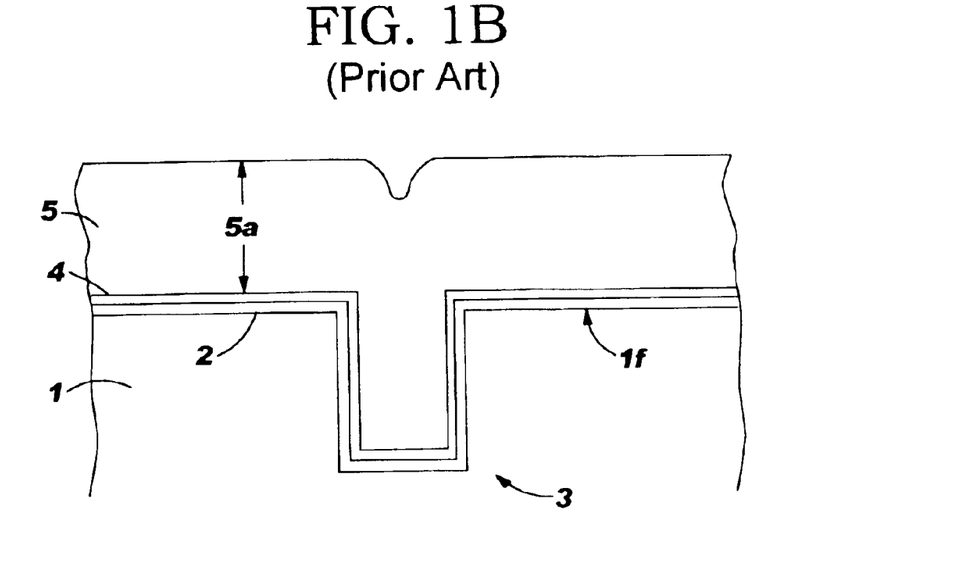
FIGS. 1B and 1C show a semiconductor wafer on which typical plating processes have been performed.
Figure 1C:
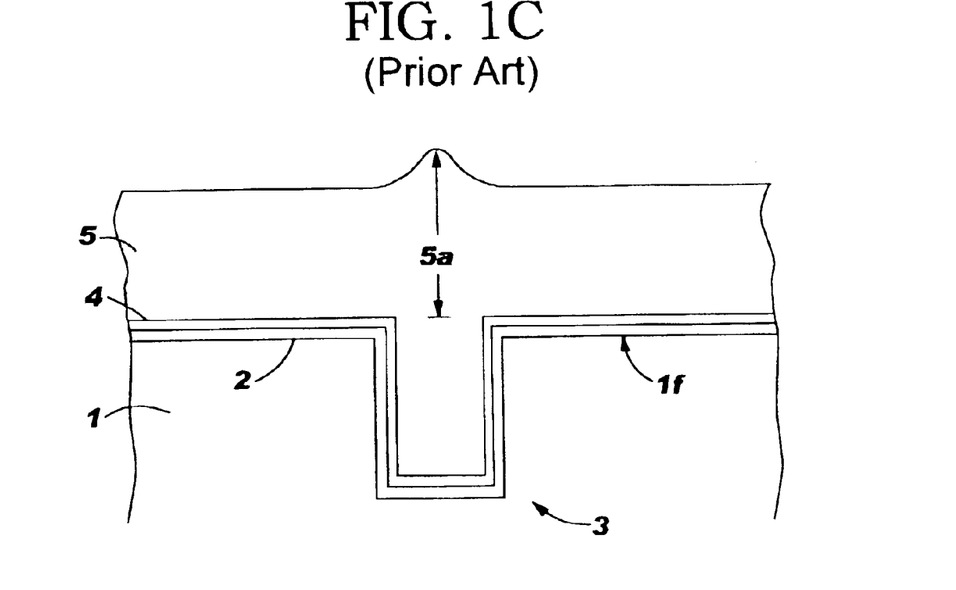

FIG. 1B shows a wafer feature after a typical Cu plating process. Semiconductor wafer 1, which has a trench 3 formed therein, is coated first with a barrier/liner layer 2, to promote adhesion of the plated metal layer to the wafer and to prevent diffusion of the Cu into the semiconductor material. A seed layer 4 is then deposited on layer 2. The electroplated Cu layer 5 fills the trench and coats the wafer surface. As shown in the figure, the plated layer must be thick enough to ensure that the trench is filled. Under some process conditions the greatest thickness is in the vicinity of the trench, as shown in FIG. 1C. The excess thickness 5a, termed "overburden," is then removed by CMP. Often the entire plated layer above the wafer surface is removed so that copper metal remains only inside the trench 3; this may be done by polishing the wafer in a CMP apparatus until the original front surface 1f of the wafer is exposed.

Plating and planarization of the metal layer are conventionally done in separate tools. As noted above, processing of a typical wafer requires several different plating steps, with each followed by a planarization step. A typical wafer therefore is processed multiple times in both the plating and planarization tools. This situation tends to limit the throughput of the manufacturing process, and accordingly increases the overall manufacturing cost.

U.S. Pat. No. 6,004,880, titled "Method of single step damascene process for deposition and global planarization," suggests adapting a CMP apparatus to perform plating and polishing simultaneously. However, plating and polishing often require different process conditions (e.g. different mechanical force on the wafer surface), which cannot be obtained in a simultaneous process. Furthermore, if a polishing slurry containing an abrasive is combined with an electrolyte plating solution, abrasive particles may be trapped in the plated metal layer.

U.S. Pat. No. 5,911,619, titled "Apparatus for electrochemical mechanical planarization," describes a polishing apparatus in which electrodes contact the wafer, so that CMP and electrochemical machining techniques may be combined in order to improve planarization throughput. This apparatus is used only for planarization (that is, removal of material from the wafer); electroplating of the wafer requires a separate apparatus.

There remains a need for a wafer processing tool which integrates the features of electroplating and planarization tools, and thus can perform alternating electroplating and electroetching processes, together with CMP (particularly for copper layers), with optimized conditions for each process.

SUMMARY OF THE INVENTION

The present invention addresses the above-described need by providing a process and apparatus for performing both electroplating of a metal layer and planarization of the layer on a substrate.

According to a first aspect of the invention, the apparatus includes a table with a polishing pad; the table and pad have holes therein forming channels for dispensing an electroplating solution onto the pad. A plurality of electroplating anodes are disposed in the channels and are in contact with the electroplating solution. The apparatus also includes a carrier for holding the substrate substantially parallel to the top surface of the pad and for applying variable mechanical force on the substrate against the pad; the carrier rotates with respect to the table and includes a plating cathode. The apparatus further includes a slurry dispenser for dispensing a polishing slurry on the pad during a CMP process.

The carrier applies a first amount of force during an electroplating process and a second amount of force during an electroetching process. During a plating process, it is preferable that the force be varied to maintain a predetermined spacing between the substrate and the pad. In the initial plating process for a dual damascene structure, this spacing should be between 5 $\mu$m and 100 $\mu$m.

The channels are advantageously arranged in a plurality of concentric arrays each having an anode therein, so that the anodes are arranged in concentric arrays each having a separate electrical connection to the cathode.

It is noteworthy that when a conductive line or via is being formed, the first amount of force is greater than the second amount of force, so that the distance between the substrate and the top surface of the pad is greater during an electroetching process than during an electroplating process.

The table and pad may have additional arrays of holes to form channels for dispensing the polishing slurry during the CMP process.

According to another aspect of the invention, a method is provided for performing both electroplating of a metal layer and planarization of the layer on a substrate in an integrated plating/planarization tool having a substrate carrier and a table with a polishing pad disposed thereon. In this method, the substrate is loaded on the carrier, and electroplating solution is dispensed onto the pad. Metal is then electroplated on the substrate using the electroplating solution, while a first amount of mechanical force is applied on the substrate against the pad to maintain a first spacing between the substrate and the pad. An electroetching solution is then dispensed onto the pad, and the metal on the substrate is electroetched, while a second amount of mechanical force is applied on the substrate against the pad to maintain a second spacing between the substrate and the pad. The electroplating and electroetching may be repeated as a sequence a plurality of times. The method may further include the step of polishing the metal by chemical-mechanical polishing (CMP) using the polishing pad and a non-abrasive slurry dispensed on the pad. The table may have a plurality of plating anodes connected thereto and arranged in separate concentric arrays; in the electroplating step, a selected array may be connected to a voltage source so as to control the thickness of the metal plated on the substrate. The electroetching may be performed using the electroplating solution; in this instance, current is conducted between the cathode and the anodes in a forward direction during the electroplating and in a reverse direction during the electroetching.

DETAILED DESCRIPTION OF THE PREFERRED EMBODIMENTS

In accordance with the present invention, an apparatus is provided which permits metal deposition (electroplating) and metal removal (electroetching) in alternating steps followed by CMP, with separate process conditions for each step, in a single chamber and without the need for removing the wafer from the apparatus. Plating and removal of copper will be described to illustrate the invention. It will be appreciated that the present invention is not limited as to the type of material deposited on the wafer.

Figure 1D:
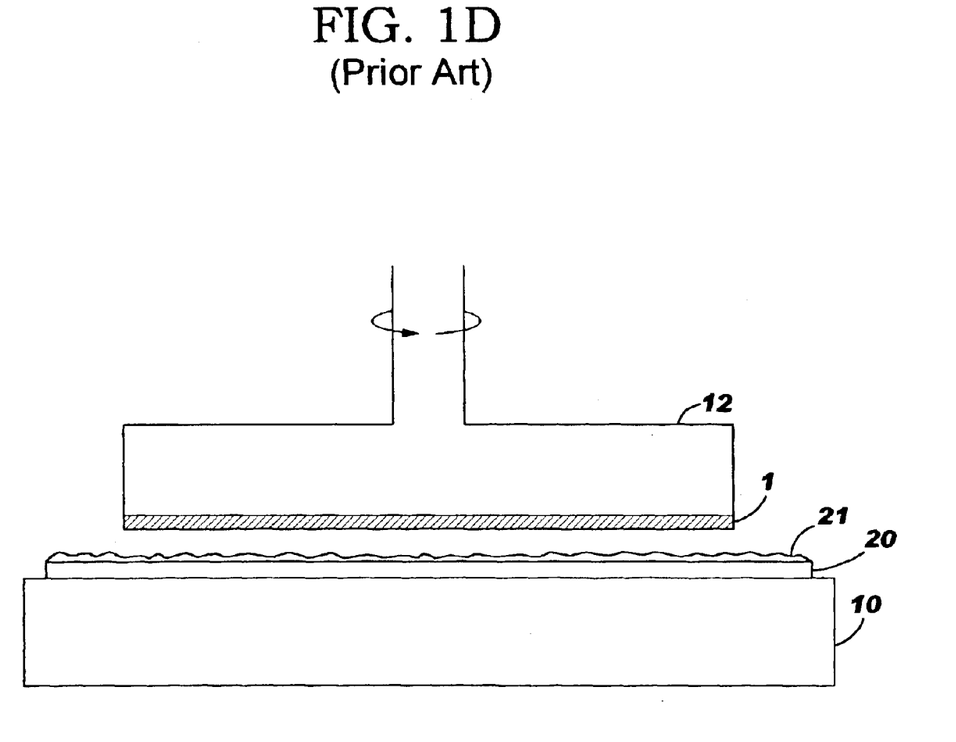
FIG. 1D is a schematic illustration of a conventional CMP apparatus used to planarize a wafer.

An embodiment of the present invention may be understood as a modification of a CMP apparatus. A conventional CMP apparatus is shown schematically in FIG. 1D. Wafer 1 is held upside down on a wafer carrier 12, which rotates with respect to a table 10 having a polishing pad 20 and polishing slurry 21 thereon. The rate of polishing is partly determined by the force with which the wafer 1 is pressed against the polishing pad 20. Wafer carrier 12 is therefore adjustable to provide a variable force on the polishing pad.

Figure 2:
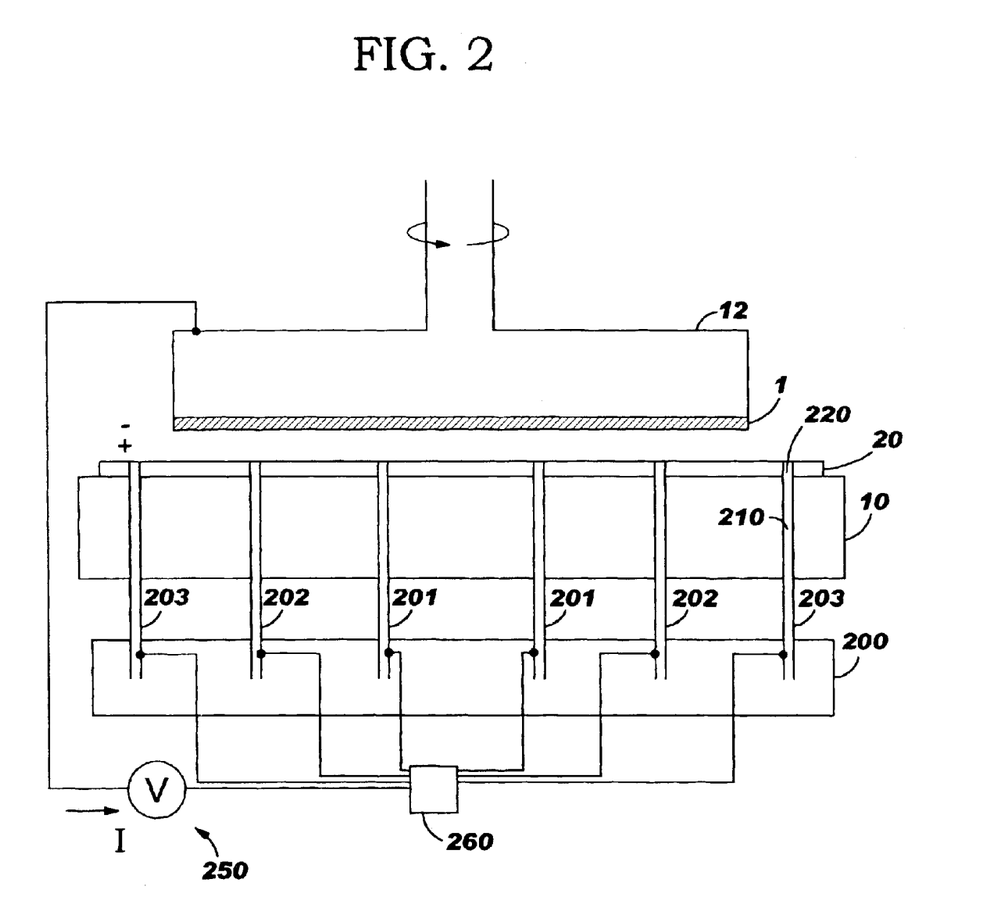
FIG. 2 is a schematic illustration of an integrated plating and planarization tool with separate concentric arrays of plating anodes, in accordance with an embodiment of the invention.

FIG. 2 is a cross-sectional view of an embodiment of the invention. Table 10 and polishing pad 20 have holes 210, 220 formed therein; the holes form channels for dispensing the plating solution onto the surface of pad 20. The plating anodes 201, 202, 203 are preferably sleeves of an electrically conducting material; the anode electrodes are immersed in the plating solution in a reservoir 200 located underneath table 10, so that the plating solution is pumped through the sleeves. Alternatively, the sleeves may be of an insulating material while the anodes consist of wires inserted in the sleeves. During a plating process, the plating solution is pumped from reservoir 200 through holes 220 and thus dispensed onto the surface of pad 20.

The anodes are preferably arranged in concentric arrays, connected to a switching device 260 which in turn is connected to plating voltage source 250. Accordingly, the plating current may be switched so that (for example) current passes only through anodes 203, then anodes 202, and then anodes 201. The plating circuit is completed when wafer 1 on carrier 12 (the plating cathode) is brought into contact with the plating solution. It should be noted that the plating solution is continuously dispensed on the pad 20 (typically at a rate of 100–400 ml/min) while the wafer rotates with respect to the pad; the supply of plating solution to the wafer is thus constantly refreshed. Table 10 may also be made to rotate, with the electrical connections to wafer carrier 12 being realized using sliding contacts or the like.

Figure 3:
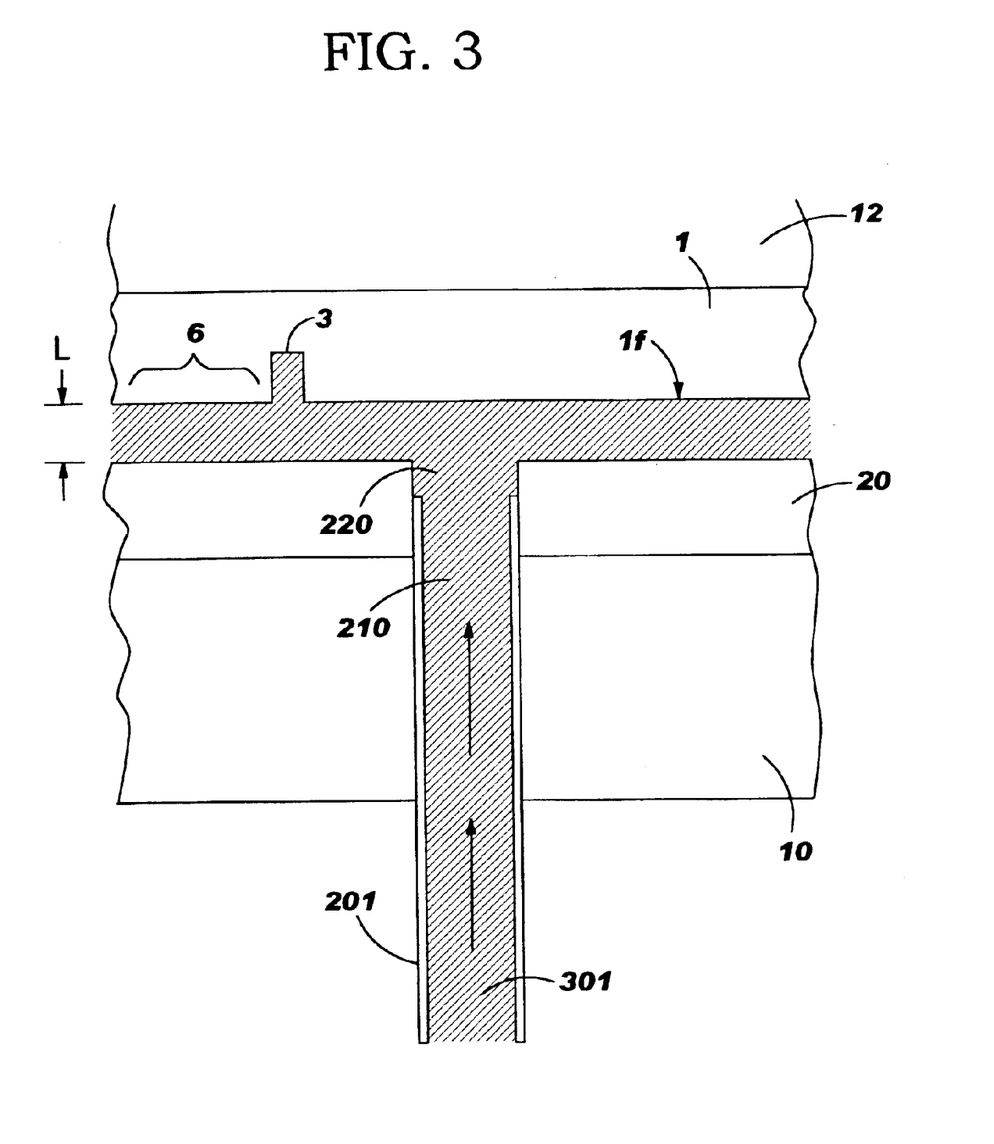
FIG. 3 is a detail view showing plating solution being continuously dispensed during a plating process, in accordance with the present invention.

FIG. 3 is a detail view of the apparatus of FIG. 2, showing plating solution 301 being pumped through anode 201 inserted in holes 210 and 220. The flow of plating solution across the surface of pad 20 has a characteristic boundary layer thickness BL. Wafer 1 is held by wafer carrier 12 so that the front surface 1f of the wafer is a distance L from the surface of pad 20. When the plating process involves forming a conducting line or via, the wafer may be divided into two types of regions: recessed regions 3 (in which metal deposition is desired) and field regions 6 (on which metal deposition is not desired). During a plating process to form such conductive lines, the wafer carrier is adjusted to apply a downward force on wafer 1 so that the spacing between wafer and pad is much less than the boundary layer thickness:

$$L \ll BL \text{ when plating lines or vias} \qquad (1)$$

When inequality (1) is satisfied, the supply of copper ions to region 6 is mass-diffusion limited and is therefore much less than to region 3 (region 6 is said to be "semi-dry"). The plating rate in region 6 is correspondingly lower than in region 3. Copper lines and vias are thus selectively formed in the recessed areas of the wafer with reduced overburden.

A sequence of plating and planarization processes generally begins with a plating step. In particular, in a dual damascene process the recesses in the wafer are filled during the initial electroplating step. It has been found that the applied force on the wafer during this initial electroplating step should be controlled so that the spacing between the wafer and the pad is between 5 $\mu$m and 100 $\mu$m.

The rotation of wafer carrier 12 and/or table 10 ensures that the plating solution on the pad surface is continuously replenished, so that the concentration of copper ions is constant.

As noted above, the anodes are arranged in separate concentric arrays, so that plating may be performed in separate concentric zones on the wafer. This permits control of the plating profile across the wafer. This feature is particularly useful in building up a Cu seed layer when the initial seed layer is very thin (about 200 Å). In this case, current is first passed through the outer zone only (anodes 203), so that about 500 Å is deposited on the outer edge of the wafer. Current is then switched to the next inner zone (anodes 202) to deposit another 500 Å thereon; a lesser amount is deposited in the other zones. Plating is performed in successive inner zones until a full seed layer is obtained.

Figure 4A:
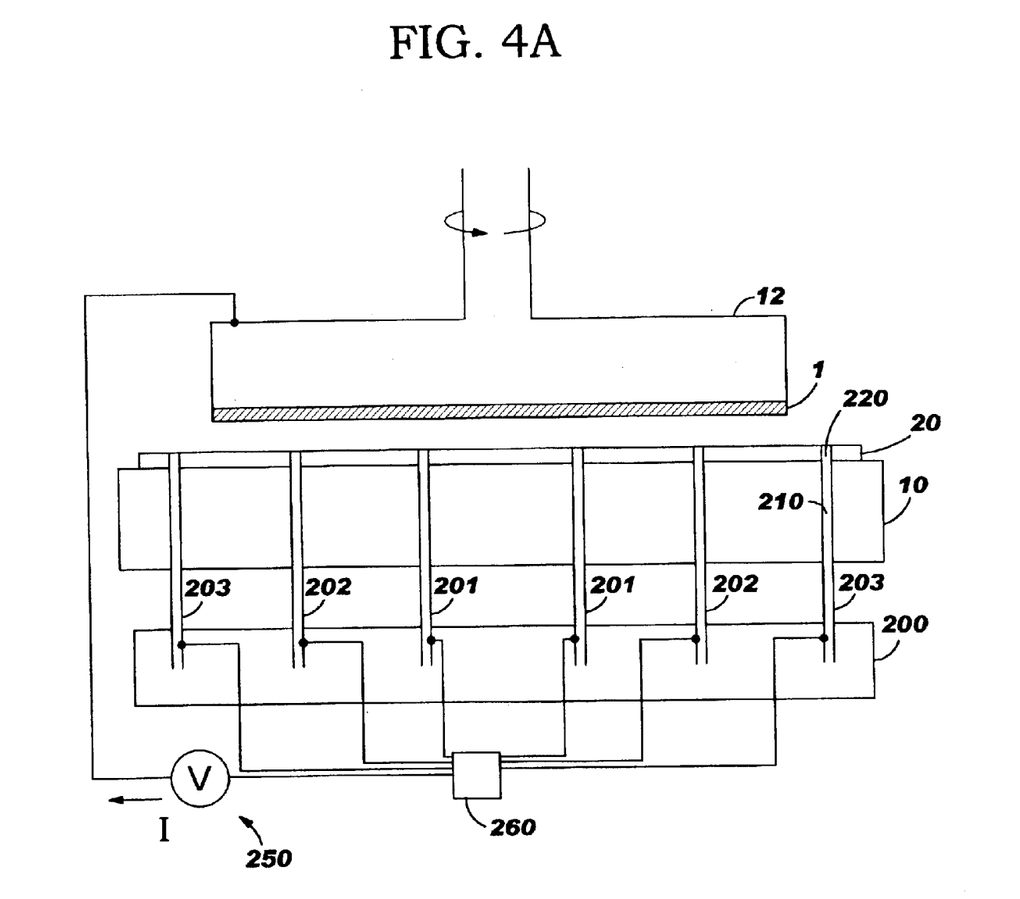
FIG. 4A is a schematic illustration of the integrated tool of FIG. 2, in which reverse-pulse electroetching is performed.

In a preferred embodiment of the invention, alternating plating and etching processes are performed to limit the growth of the overburden. This may be done by electroetching of the plated metal using the same solution as in the plating process, but with a very high anodic reverse voltage pulse (see FIG. 4A). During the etching step, the downward force on the wafer is reduced so that the spacing between the wafer 1 and pad 20 is much greater than the boundary layer thickness:

$$L \gg BL \text{ when electroetching} \quad (2)$$

A salt film is formed on the Cu surface during the reverse voltage pulse; the salt film has a variable thickness, and is thicker in region 3 than in region 6. When inequality (2) is satisfied, the removal rate of the plated Cu is controlled by the diffusion of Cu ions through the salt film. The etching rate in region 6 is thus generally greater than the etching rate in region 3.

It should be noted that when the anode voltage is reversed to switch from plating to etching, the downward force on the wafer is varied in accordance with the change in the anode voltage. Repetition of plating steps (where region 3 plates faster than region 6) and etching steps (where region 3 etches more slowly than region 6) results in the recessed areas of the wafer being filled with metal with very little overburden.

Electroetching may also be performed by rapidly replacing the plating solution in reservoir 200 with an etching solution (requiring only a few seconds), and then electroetching using the voltage source 250, switching device 260 and anodes 201–203 as described above. For example, concentrated phosphoric acid may be used in electroetching of copper, to form a salt film on the copper surface. The salt film will have a higher density in region 3 than in region 6, so that the etching rate is generally greater in region 6 than in region 3.

Figure 4B:
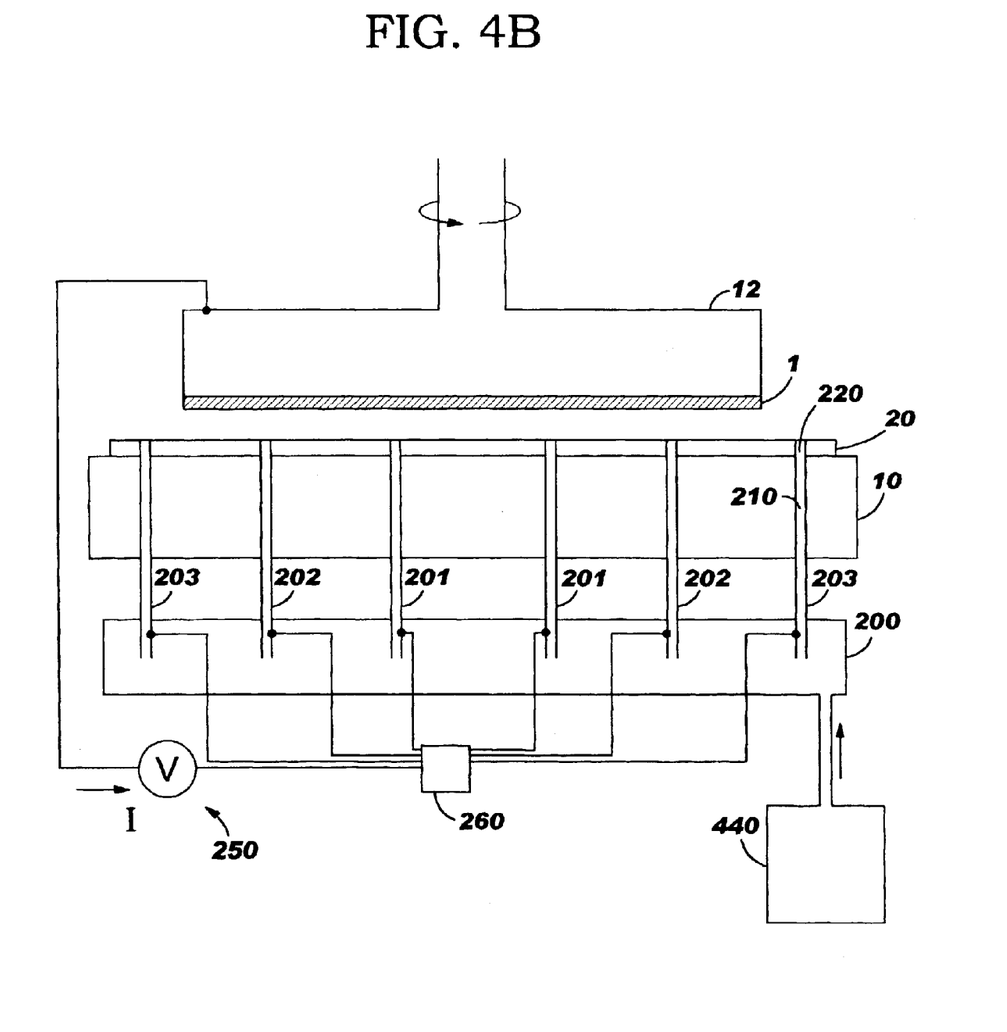
FIG. 4B is a schematic illustration of the integrated tool of FIG. 2, in which electroetching is performed by promoting formation of a film on the wafer.

In a variation of the foregoing embodiments, a salt-forming agent such as benzotriazole (BTA) is added to the plating or etching solution during the electroetching process. When the process is switched from plating to etching, BTA in container 440 is injected into the reservoir 200 (FIG. 4B). The addition of BTA to the solution results in a salt film on the wafer which exhibits a high field conduction mechanism; this in turn increases the etch selectivity in favor of the field regions (that is, etch rate in region 6 vs. etch rate in region 3). This has the effect of reducing the required number of repeated plating and etching operations.

In a preferred embodiment of the invention, capabilities for plating, etching and CMP are combined in a single apparatus. The sequence of plating and etching steps may terminate with a final etching step in which the overburden 5a is removed, after which the wafer may be removed without CMP being performed. However, if it is desired to remove both the overburden and the liner/barrier layer 2 on the wafer surface, the wafer is polished after a sequence of plating and etching, as detailed below.

Figure 5:
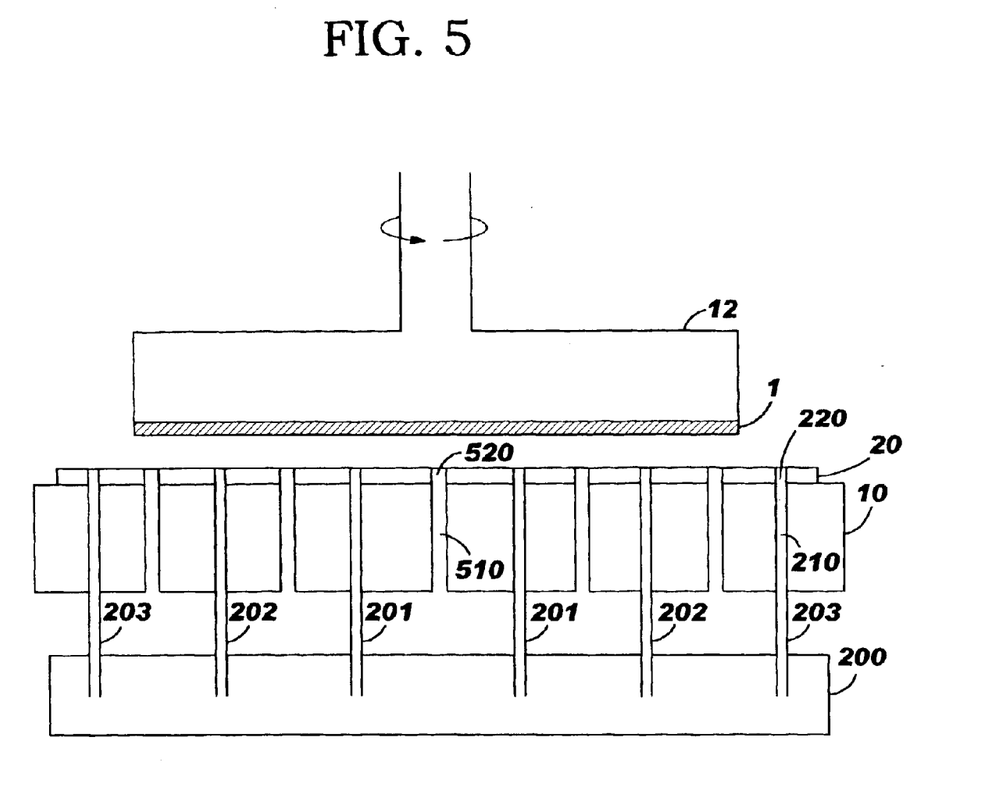
FIG. 5 is a schematic illustration of an integrated plating and planarization tool according to an embodiment of the invention, where CMP slurry and plating solution are dispensed on the surface of the polishing pad.

An embodiment of the invention, in which both plating solution and CMP slurry are dispensed from underneath table 10, is shown in FIG. 5. An additional array of holes 510, 520 is provided in table 10 and pad 20 respectively (see FIG. 5), to form channels through which the polishing slurry is pumped onto the pad surface from a slurry reservoir (not shown) beneath table 10. These holes are arranged in a concentric pattern as shown in FIG. 5. Alternatively, the slurry may be dispensed onto pad 20 from above. In order to switch the tool from plating/etching to polishing, pad 20 is rinsed with deionized water, and a non-abrasive slurry is dispensed on the pad. (The pad may also be conditioned using a diamond conditioning head at a convenient time before a new wafer is loaded, as is standard in the CMP art.) It should be noted that the slurry used in the Cu CMP process is an abrasive-free solution, so that roughening and chemical alteration of the remaining Cu surface are avoided.

The apparatus may advantageously include a pencil or brush cleaner for the wafer, so that the wafer may be cleaned and dried after polishing before it is removed from the tool.

Figure 6:
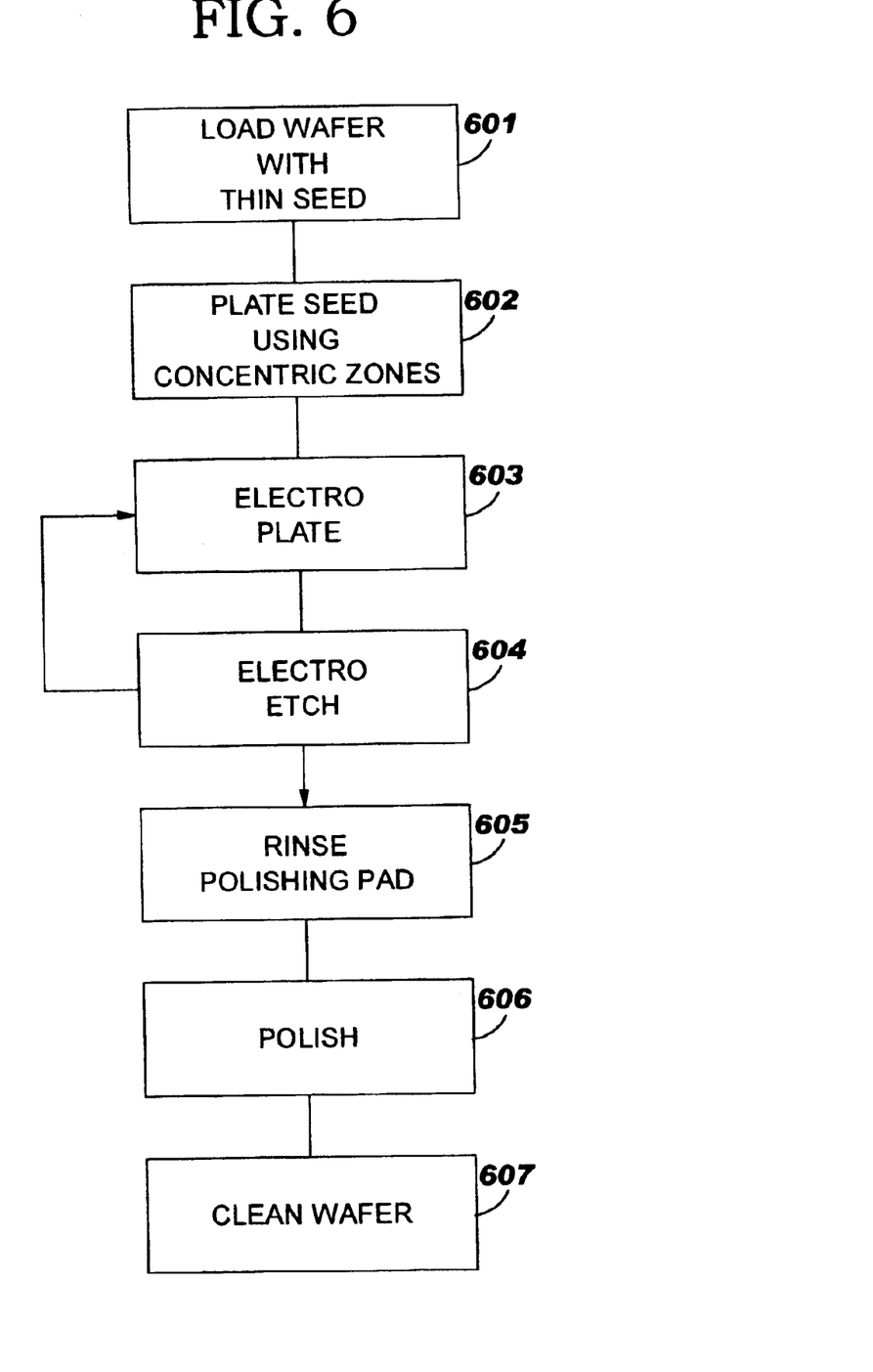
FIG. 6 is a simplified flowchart of an integrated plating and planarization process in accordance with the invention.

FIG. 6 illustrates steps in a process sequence where electroplating, electroetching and CMP are all performed in the apparatus of the present invention. A wafer with a thin seed layer is loaded onto the tool (step 601); the seed layer is then built up by plating the wafer using the separate, concentric anode arrays to control the profile of the plated layer (step 602). Electroplating is performed, typically for a period of about 20 sec. (step 603), followed by electroetching for a period of about 10 sec. (step 604). Plating and etching are repeated until the desired plated features are obtained. (The plating and etching are performed as distinct steps, as opposed to attempting to plate and etch simultaneously.) As noted above, the force on the wafer is varied between plating and etching steps (more downward force during plating, less during etching). At the conclusion of the plate/etch sequence, the overburden is only about 500 Å. The polishing pad 20 is then rinsed (step 605), and polishing is performed with a non-abrasive slurry to remove the overburden and excess barrier/liner layer (step 606). Finally, the wafer is cleaned prior to being unloaded (step 607).

Other features may be added to the apparatus to extend its capabilities and to provide still greater process flexibility. In particular, the tool may be equipped with a heater to permit annealing of the copper as it is plated. The tool may also have a separate annealing chamber for performing an additional anneal before the wafer is removed.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

We claim:

1. An apparatus for performing both electroplating of a metal layer and planarization of said layer on a substrate, the planarization being performed by electroetching and chemical-mechanical polishing (CMP), the apparatus comprising:

a table for supporting a polishing pad and having a plurality of holes forming channels for dispensing an electroplating solution onto the pad;

the polishing pad, having a top surface and having a plurality of holes therethrough corresponding to the holes in the table;

a plurality of electroplating anodes disposed in said channels and in contact with the electroplating solution;

a carrier for holding the substrate substantially parallel to the top surface of the pad and for applying variable mechanical force on the substrate against the pad, the carrier rotating with respect to the table and including a plating cathode; and a slurry dispenser for dispensing a polishing slurry on the pad during a CMP process, wherein the carrier applies a first amount of force during an electroplating process and a second amount of force during an electroetching process.

2. An apparatus according to claim 1, wherein the channels are arranged in a plurality of concentric arrays.

3. An apparatus according to claim 2, wherein an anode is disposed in each of said channels, so that the anodes are arranged in a plurality of concentric arrays each having a separate electrical connection to the cathode.

4. An apparatus according to claim 1, wherein the first amount of force is greater than the second amount of force, so that a distance from the substrate to the top surface of the pad is greater during an electroetching process than during an electroplating process.

5. An apparatus according to claim 1, wherein the first amount of force is variable so as to maintain a predetermined distance from the substrate to the top surface of the pad during an electroplating process.

6. An apparatus according to claim 5, wherein the predetermined distance is between 5 $\mu$m and 100 $\mu$m.

7. An apparatus according to claim 1, further comprising a voltage source connected to the cathode and to the anodes, whereby current is conducted between the cathode and the anodes in a forward direction during an electroplating process and in a reverse direction during an electroetching process.

8. An apparatus according to claim 1, wherein an electroetching solution is dispensed through the channels during an electroetching process.

9. An apparatus according to claim 1, wherein the table has an additional array of holes and the pad has an additional array of corresponding holes to form channels for dispensing the polishing slurry during the CMP process.

10. A method for performing both electroplating of a metal layer and planarization of said layer on a substrate in an integrated plating/planarization tool having a substrate carrier and a table with a polishing pad disposed thereon, the method comprising the steps of:

loading the substrate on the carrier;

dispensing electroplating solution onto the pad;

electroplating the metal on the substrate using the electroplating solution, while applying a first amount of mechanical force on the substrate against the pad to maintain a first spacing between the substrate and the pad;

dispensing an electroetching solution onto the pad; and electroetching the metal on the substrate using the electroetching solution, while applying a second amount of mechanical force on the substrate against the pad to maintain a second spacing between the substrate and the pad.

11. A method according to claim 10, wherein said electroplating and said electroetching comprise a plate/etch sequence which is repeated a plurality of times.

12. A method according to claim 10, wherein the metal is copper.

13. A method according to claim 10, further comprising the step, after said electroetching step, of polishing the metal on the substrate by chemical-mechanical polishing (CMP) using the polishing pad and a non-abrasive slurry dispensed on the pad.

14. A method according to claim 10, wherein the carrier is a plating cathode and the table has a plurality of plating anodes connected thereto and arranged in separate concentric arrays, and said electroplating step further comprises connecting a selected array to a voltage source so as to selectively plate a portion of the substrate.

15. A method according to claim 14, wherein said electroetching is performed using the electroplating solution, and current is conducted between the cathode and the anodes in a forward direction during said electroplating and in a reverse direction during said electroetching.

16. A method according to claim 10, wherein said first amount of force is greater than said second amount of force, so that said first spacing is less than said second spacing.

17. A method according to claim 10, wherein said first spacing is between 5 $\mu$m and 100 $\mu$m.

18. A method according to claim 13, wherein said polishing step further comprises the step of rinsing the polishing pad before performing CMP.

19. A method according to claim 10, wherein said electroetching step further comprises injecting a salt-forming agent into the electroetching solution.

20. A method according to claim 13, further comprising the step of cleaning the substrate after CMP is performed.

* * * * *